(12) United States Patent
Majeed et al.

(10) Patent No.: US 10,816,630 B2
(45) Date of Patent: Oct. 27, 2020

(54) METHOD FOR COMPUTING OPTIMAL DIFFUSION ENCODING GRADIENT WAVEFORMS FOR MRI

(71) Applicant: Ohio State Innovation Foundation, Columbus, OH (US)

(72) Inventors: Waqas Majeed, Dublin, OH (US); Arunark Kolipaka, Delaware, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 184 days.

(21) Appl. No.: 16/015,291

(22) Filed: Jun. 22, 2018

(65) Prior Publication Data

US 2018/0372828 A1 Dec. 27, 2018

Related U.S. Application Data

(60) Provisional application No. 62/524,729, filed on Jun. 26, 2017.

(51) Int. Cl.
*G01R 33/563* (2006.01)
*G01R 33/561* (2006.01)
*G01R 33/54* (2006.01)

(52) U.S. Cl.
CPC ...... *G01R 33/56341* (2013.01); *G01R 33/543* (2013.01); *G01R 33/5616* (2013.01)

(58) Field of Classification Search
CPC .................. G01R 33/56341; G01R 33/543
USPC ....................................................... 324/309
See application file for complete search history.

(56) References Cited

U.S. PATENT DOCUMENTS 8,508,225 B2* 8/2013 Granlund ........... G01R 33/5614
324/307
9,513,358 B2* 12/2016 Levin ............... G01R 33/56509

OTHER PUBLICATIONS

Aliotta et al., "Convex optimized diffusion encoding (CODE) gradient waveforms for minimum echo time and bulk motion-compensated diffusion-weighted MRI.", MRM 2017, 717-729.
(Continued)

*Primary Examiner* — Reena Aurora
(74) *Attorney, Agent, or Firm* — Meunier Carlin & Curfman LLC

(57) ABSTRACT

A method of obtaining analytical expressions for an optimized diffusion encoding gradient (DEG) waveform is disclosed. The method uses a constrained numerical optimization to obtain an optimal configuration of a DEG waveform. The optimization adjusts parameters for a waveform modeled as a finite set of square pulses to maximize an exact b-value equation, while maintaining a waveform shape that also compensates for motion. The optimal configuration is then verified using a waveform model of a set of trapezoidal pulses to obtain an optimal DEG waveform. Generally, the parameters describing the reduced set of trapezoidal pulses are reduced, thereby allowing the optimal DEG waveform to be expressed as closed-form analytical expressions. The analytical expressions simplify the derivation of optimal DEG waveforms for a range of diffusion imaging scanning parameters, thereby improving the quality and versatility of diffusion weighted MRI.

18 Claims, 6 Drawing Sheets

(56) References Cited

OTHER PUBLICATIONS

Von Knobelsdorff-Brenkenhoff, et al. "Myocardial T1 and T2 mapping at 3 T: reference values, influencing factors and implications." Journal of Cardiovascular Magnetic Resonance 15.1 (2013): 53.

* cited by examiner

METHOD FOR COMPUTING OPTIMAL DIFFUSION ENCODING GRADIENT WAVEFORMS FOR MRI

CROSS REFERENCE TO RELATED APPLICATION

This application claims priority to and benefit of U.S. provisional patent application Ser. No. 62/524,729 filed Jun. 26, 2017, which is fully incorporated by reference and made a part hereof.

FIELD OF THE INVENTION

The present disclosure relates to diffusion weighted (DW) magnetic resonance imaging (MRI) and more specifically, to a method for computing diffusion encoding gradient (DEG) waveforms that (i) are optimized by adjusting a parametric model of a waveform to maximize an exact expression of b-value and (ii) can be represented by closed-form mathematical expressions.

BACKGROUND

DW MRI (e.g., diffusion tensor imaging) is an important imaging technique that can be used to visualize the diffusion of water molecules, which can provide microscopic details of tissue architectures (e.g., axonal fibers in the brain, muscle fibers in the heart, etc.). MRI images can be diffusion weighted by sensitizing the MRI images to the random motion (i.e. self-diffusion) of water molecules by applying (i.e., playing) DEG waveforms during certain periods in an MRI pulse sequence.

A parameter called the b-value determines how sensitive the images are to self-diffusion. A b-value depends on aspects of a DEG waveform (e.g., duration, shape, etc.). It is often desirable to minimize the duration of the DEG waveform. By minimizing the duration, signal losses due to $T_2$ decay can be reduced because the duration of the DEG waveform and the echo time (TE) are closely linked. Additionally, it is often desirable that the images are sensitized only to the self-diffusion of water rather than other kinds of motion (e.g., bulk motion or flow). Accordingly, DEG waveforms can be motion compensated by adjusting their shape. For example, velocity is compensated when the DEG waveform's first moment (M1) equals zero, while acceleration is compensated when the DEG waveform's second moment (M2) equals zero.

A need therefore exists for a method to optimize DEG waveforms to have the shortest duration for a given b-value, while also compensating for motion other than diffusion.

Prior work has attempted to address this need using a method named CODE (Convex Optimized Diffusion Encoding) to obtain optimized DEG waveforms (e.g., see Aliotta et al., "*Convex optimized diffusion encoding (CODE) gradient waveforms for minimum echo time and bulk motion-compensated diffusion-weighted MRI.*", MRM 2016, which is hereby incorporated entirely by reference).

CODE waveforms, however, are not optimal because it is possible to obtain DEG waveforms with a shorter duration for a given b-value and degree of motion compensation. In addition, CODE requires numerical optimization to obtain DEG waveforms. For example, CODE computes the samples of DEG waveforms numerically based on a set of anticipated imaging parameters (e.g., TE, resolution, etc.).

CODE waveforms must be calculated in advance of MRI imaging and then copied to a scanner computer. Thus, DEG waveforms for all anticipated imaging parameters must computed. The flexibility of this approach is limited because it is not practical to compute DEG waveforms for every possible imaging scenario and then store each of these waveforms on a scanning computer.

To address the drawbacks of the CODE method, the present disclosure embraces a method called Motion Compensated Optimized Diffusion Encoding (i.e., MODE). MODE has a number of advantages. First, for a given b-value and degree of motion compensation, MODE provides shorter DEG waveforms than CODE. In fact, the DEG waveforms computed using MODE (i.e., MODE waveforms) are optimized to be the shortest duration available to date. Second, MODE provides mathematical formulas to generate an exact MODE waveform for a given set of imaging parameters without having to compute and store an entire DEG waveform. Third, MODE optimizes parameters of a waveform model rather than optimizing samples of a waveform. This approach is less complicated because the number of parameters is typically far less than the number of samples.

The MODE method embraced by the present disclosure has the ability to provide optimally short DEG waveforms with motion compensation, which results in superior imaging quality. Additionally, the DEG waveforms can be generated from analytical expressions (i.e., equations) derived using the MODE process so that, for a given set of imaging parameters, an optimal DEG waveform may be computed nearly instantly without the need for storing/recalling waveforms to/from memory. This "on the fly" computation of optimal DEG waveforms is highly desirable, especially for commercial MRI systems used in clinical settings.

SUMMARY

In one aspect, the present disclosure embraces a method for determining a DEG waveform for an MRI pulse sequence running on an MRI system. In the method, equations for a DEG waveform are determined by optimizing a parametric waveform model according to (i) timing constraints of the MRI pulse sequence, (ii) system constraints of the MRI system, and (iii) motion compensation constraints. The optimization maximizes an exact equation for a b-value given a parameter of the MRI pulse sequence (e.g., TE). After the equations are determined, the DEG waveform may be computed using the equations given a b-value for a desired diffusion weighting. The DEG waveform that is computed minimizes the echo time (TE) (thereby maximizing image signal) while compensating for motion.

In an exemplary embodiment of the method, the parametric waveform model includes a plurality of pulses that are each described by an amplitude, a start time, an end time, and a ramp time.

In other possible embodiments of the method, the timing constraints of the MRI pulse sequence require the plurality of pulses to fill a first slot (SLOT_1) and a second slot (SLOT_2) that are separated by a period (e.g., a period which includes a 180-degree radio frequency (RF) pulse). Additionally or alternatively, the timing constraints may require that no pulses in the plurality of pulses overlap.

In other possible embodiments of the method, the system constraints of the MRI system may limit the maximum amplitude of the plurality of pulses (e.g., to equal the maximum capability of the gradients in the MRI system). Additionally or alternatively, the system constraints may limit the minimum ramp time of the plurality of pulses (e.g., according to FDA guidelines).

In other possible embodiments of the method, the motion compensation constraints may require a first moment (M1) of the DEG waveform to equal zero. Additionally, the motion compensation constraints may require a second moment (M2) of the DEG waveform to equal zero.

In another exemplary embodiment of the method, the MRI pulse sequence is an echo-planar imaging (EPI) pulse sequence.

In another exemplary embodiment of the method, the exact equation for b-value is $$b = \gamma^2 \int_0^{\tau_{diff}} (\int_0^t G(u)du)^2 dt,$$

wherein $\gamma$=gyromagnetic ratio, $G(u)$=gradient amplitude, t=time, and $\tau_{diff}$ is the time utilized for diffusion preparation (e.g., the time of readout in the MRI pulse sequence).

In another exemplary embodiment of the method, the optimization of the parametric waveform model includes adjusting parameters of a plurality of square pulses to determine an optimal waveform configuration. In some cases, the optimal waveform configuration defines a distribution of square pulses between available slots in the MRI pulse sequence. Additionally or alternatively, the optimal waveform configuration defines polarities and/or magnitudes of the plurality of square pulses. For example, the magnitudes of the plurality of square pulses may, in many cases, be a maximum gradient strength of the MRI system. In some exemplary implementations of the method, the optimal configuration may effectively combine adjacent pulses having the same magnitude and polarity into a single pulse. When adjacent pulses are combined, the optimal configuration may be described using fewer parameters (i.e., because the number of pulses are effectively reduced).

In another exemplary embodiment of the method, the optimization of the parametric model further comprises verifying that the optimal waveform configuration is valid for a plurality of trapezoid pulses by re-optimizing the optimal configuration using trapezoidal pulses and then comparing the results to the optimal waveform configuration of square pulses. After the optimal configuration of the trapezoidal pulses is verified, the equations for the DEG waveform can be derived from the optimal configuration of the trapezoidal pulses. The equations may be stored on the MRI system to facilitate the generation of an MRI pulse sequence that includes an optimal DEG waveform for a particular diffusion weighting.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

Figure (FIG.) 1 is a flow diagram depicting the MODE process for creating and using optimal DEG waveforms according to an exemplary embodiment of the present disclosure.

DETAILED DESCRIPTION

Figure 1:
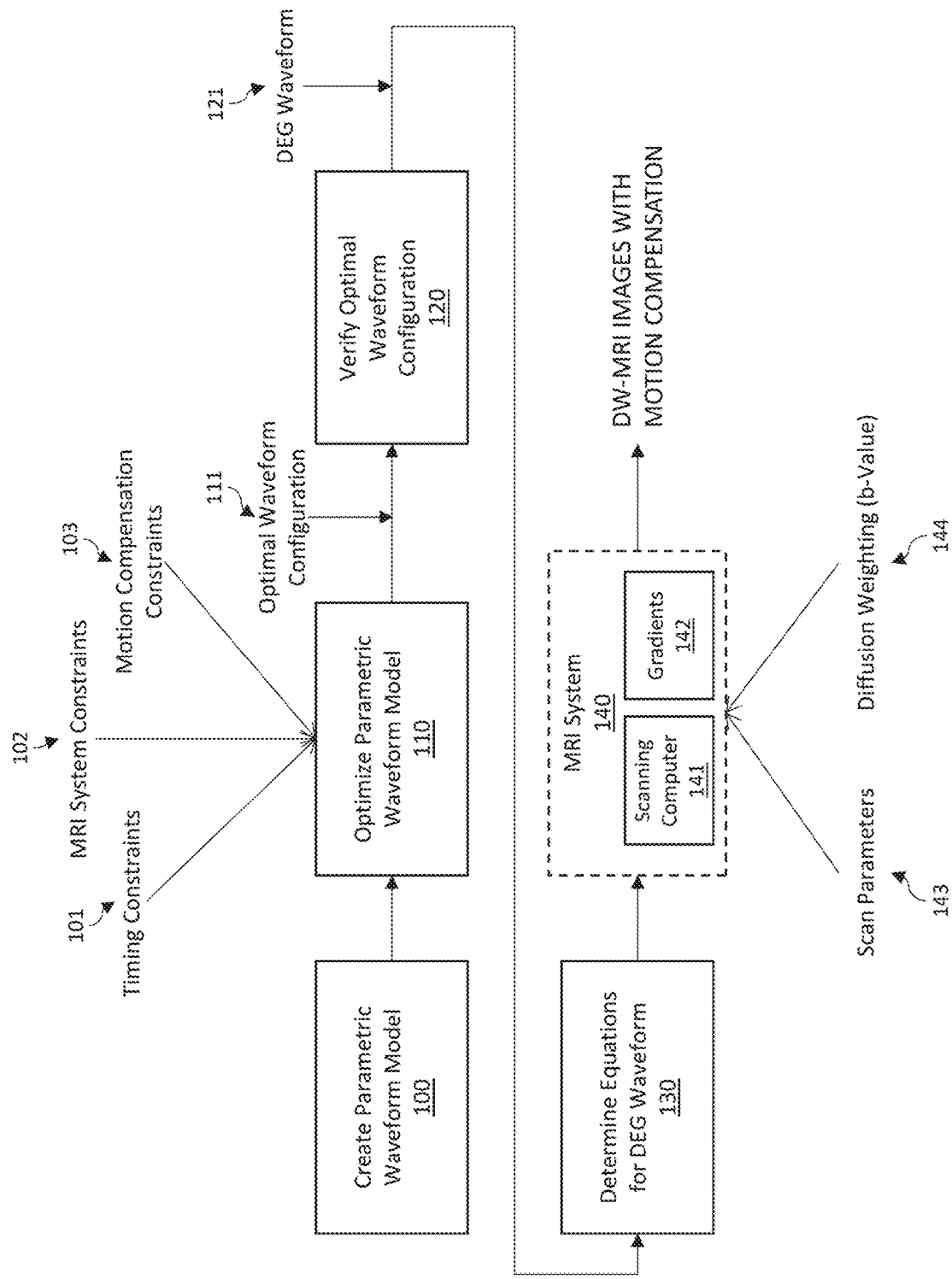

Unless defined otherwise, all technical and scientific terms used herein have the same meaning as commonly understood by one of ordinary skill in the art. Methods and materials similar or equivalent to those described herein can be used in the practice or testing of the present disclosure.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes¬ from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

The present disclosure embraces a method referred to as MODE (i.e., Motion Compensated Optimized Diffusion Encoding), which for a given b-value and degree of motion compensation, returns optimal DEG waveforms (i.e., MODE waveforms). An optimal DEG waveform is the shortest possible diffusion weighting gradient waveform for a particular MRI pulse sequence.

Typically, echo-planar MRI pulse sequences (e.g., SE-EPI) are used for DW MRI and therefore the examples, experiments, and results in the present disclosure are directed to these. In general, however, MODE may be used to create DEG waveforms for any MRI pulse sequence that utilizes diffusion preparation.

FIG. 1 is a flow diagram depicting the MODE process for creating and using optimal DEG waveforms. The first step of MODE is to create a parametric waveform model 100.

Figure 2:
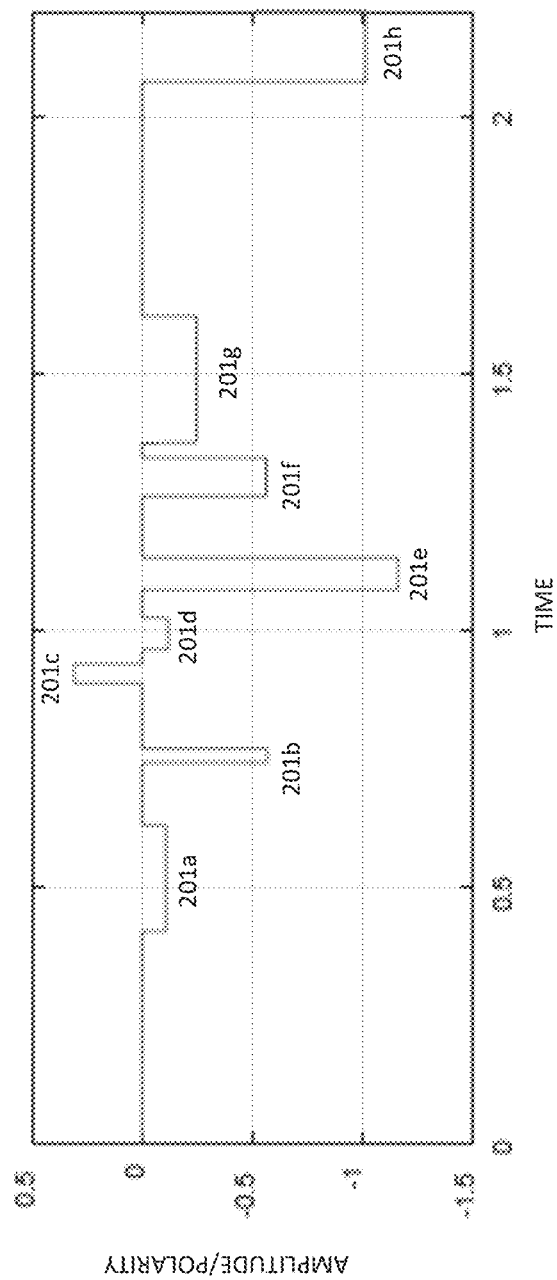
FIG. 2 graphically illustrates an exemplary parametric waveform model according to an embodiment of the present disclosure.

MODE uses a parametric approach for optimizing a waveform model instead of numerically optimizing samples of a waveform. Accordingly, the optimization is greatly simplified because MODE optimizes a handful of parameters rather than hundreds (or thousands) of samples. FIG. 2 graphically depicts an exemplary parametric waveform model. The parametric waveform model shown comprises eight pulses 201a-h that are distributed in time and have various amplitudes, polarizations, and durations. In practice, the exact number of the plurality of pulses is a balance between accuracy and computational complexity. For example, the number of pulses in the plurality may range from 2 (e.g., for waveforms without motion compensation) to 6.

The waveform model is parametric because the waveform may be described by the parameters defining each pulse. The parameters defining each pulse may include (but are not limited to) amplitude, polarity, start time, end time, and ramp time.

The waveform model is also parametric because each pulse may be described by a shape. Square pulses are shown in FIG. 2. Square pulses simplify the optimization because they have no ramp times and because adjacent pulses that have the same polarity and amplitude may be combined into a single pulse.

As shown in FIG. 1, the optimization of the parametric waveform model 110 may be constrained by timing constraints 101, MRI system constraints 102, or motion compensation constraints 103. The constraints limiting the range of parameters. Thus, the constraints may simplify the optimization and/or force the optimization to return only practical results. The constraints may also insure that the optimization returns a waveform configuration that provides one or more additional features (e.g., motion compensation).

Figure 3:
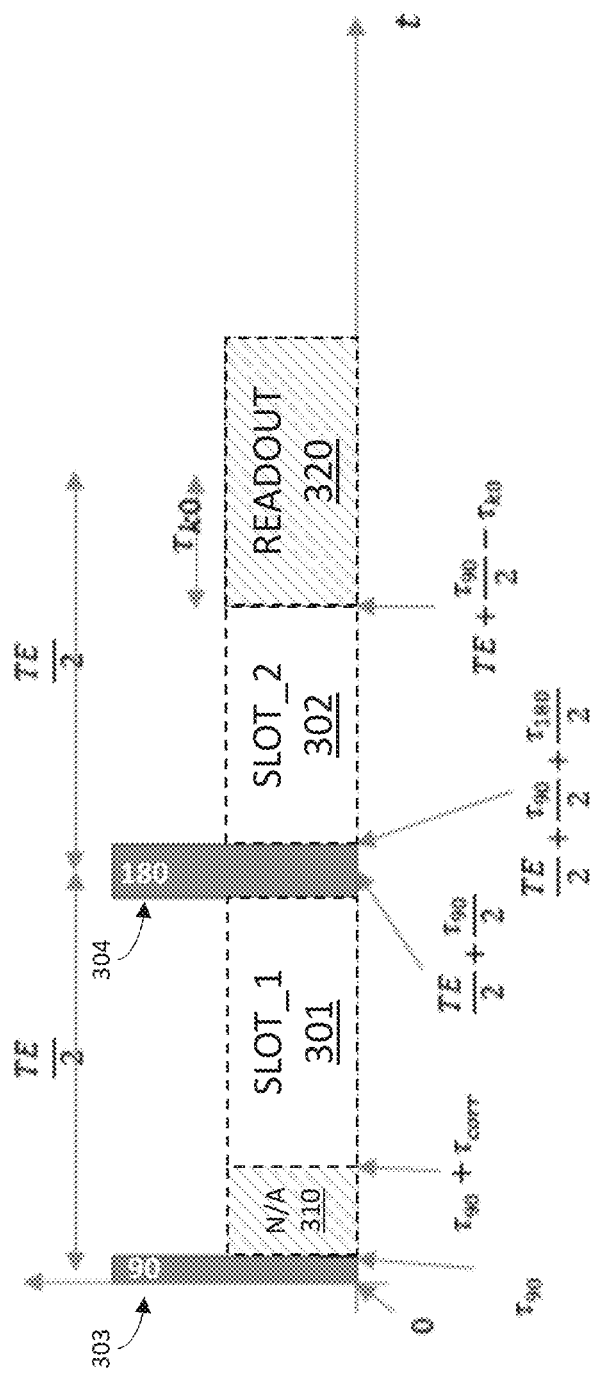
FIG. 3 graphically depicts timing constraints from an exemplary MRI pulse sequence according to an embodiment of the present disclosure.

Timing constraints 101 may limit the plurality of pulses 201a-h to one or more particular periods of time. FIG. 3 schematically depicts timing constraints for a MRI pulse sequence. In particular, a SE-EPI pulse sequence has a 180-degree radio-frequency (RF) pulse 304 spaced TE/2 after a 90 RF pulse 303. Further, a readout period 320 is centered TE after the 90-degree RF pulse 303. Finally, it is generally known that for a time period 310 immediately after the 90-degree RF pulse 303 no gradients may be played. These criteria create two time periods (i.e., slots or gaps) 301, 302 that DEG waveforms may be played in during the MRI pulse sequence. A first slot (SLOT_1) 301 is located before the 180-degree RF pulse and a second slot (SLOT_2) 302 is located after the 180-degree RF pulse. Accordingly, the parametric waveform model may be constrained so that pulses only occupy these slots.

In addition, timing constraints may specify the distribution of the plurality of pulses. For example, the timing constraints may specify that no pulses 201a-h overlap. In another example, the timing constraints may specify the distribution of the pulses 201a-h between slots 301, 302. For example, a 4-4 distribution of a plurality of 8 pulses implies the first four pulses should be in the period of SLOT_1 301 and the second four pulses should be in the period of SLOT_2 302. The two time slots may span different periods of time. As shown in FIG. 3, the exact durations of the time slots depend upon the imaging parameters (e.g., TE, Bandwidth (BW), matrix size, etc.).

MRI system constraints 102 may limit the parameters of the pulses to correspond to the physical limitations of the MRI system 140 or to other considerations such as food and drug administration (FDA) rules for patient safety. For example, the amplitudes of the pulses may be constrained so that the maximum amplitude of a pulse corresponds to the maximum signal that can be applied the gradients 142 of the MRI system 140. In another example, the speed at which the gradients turn on/off may be constrained (e.g., a minimum rise time) for patient safety.

Motion compensation constraints 103 may prescribe a particular characteristic for the DEG signals, which is based on an overall shape of the DEG waveform. For example, it is known that gradients waveforms having a zero first moment (M1) compensate (i.e., reduce the motion effect in images) velocity, while gradient waveforms having a zero second moment (M2) compensate acceleration. Accordingly, the polarities, amplitudes, and timing (e.g., start/stop times, durations, etc.) of the pulses may be adjusted to insure M1, M2 equal zero.

After the parametric waveform model is created and constrained, the parameters for the pulses are iteratively adjusted to optimize the parametric waveform model 110. The parametric waveform model is optimized based on an objective function. Here, the objective function is an exact expression for a b-value:

$$b=\gamma^2\int_0^{\tau_{diff}}(\int_0^t G(u)du)^2 dt,$$

wherein $\gamma$=gyromagnetic ratio, $G(u)$=gradient amplitude, $t$=time, and $\tau_{diff}$ is the time utilized for diffusion preparation (e.g., the time of readout in the MRI pulse sequence). The use of the exact expression in the optimization is possible because the number of the parameters is relatively few and because most parameters are constrained within a range of values.

The b-value corresponds to the imaging sensitivity to self-diffusion and therefore optimization typically requires maximizing b-values for a given TE. Alternatively, the optimization may be thought of as minimizing TE for a give b-value.

As shown in FIG. 1 the results of the optimization 110 is an optimal waveform configuration 111 (or a plurality of optimal waveform configurations if a range of TE were optimized). An optimal waveform configuration 111 defines several attributes of the DEG waveform. These attributes include (i) the distribution of pulses between the available slots (e.g. 3 pulses in the first slot, 2 pulses in the second slot), (ii) the polarities of the pulses (e.g. +−+ in the first slot, −+ in the second slot), and (iii) the magnitudes of the pulses. In practice, the maximum gradient strength is usually the optimal magnitude for pulses. Therefore, pulses typically have the same magnitude.

The use of the square pulses is used initially for optimization because while the optimization may support up to a number pulses (e.g., 8), the optimal waveform configuration may have fewer than the number pulses, which can be accommodated in the optimization by combining adjacent square pulses having the same amplitude and polarity. Therefore, waveforms with fewer than the number square pulses can result from the optimization procedure.

Verifying the optimal waveform configuration 120 may include changing parameters and repeating the optimization 110. If the optimal waveform configuration remains the same, the optimal waveform can be considered verified. For example, FIGS. 4A and 4B illustrate the results of an optimal waveform configuration with four pulses in each slot (4-4) that was optimized (e.g., using parametric nonlinear least squares) for two different echo times (TE).

Figures 4A, 4B:
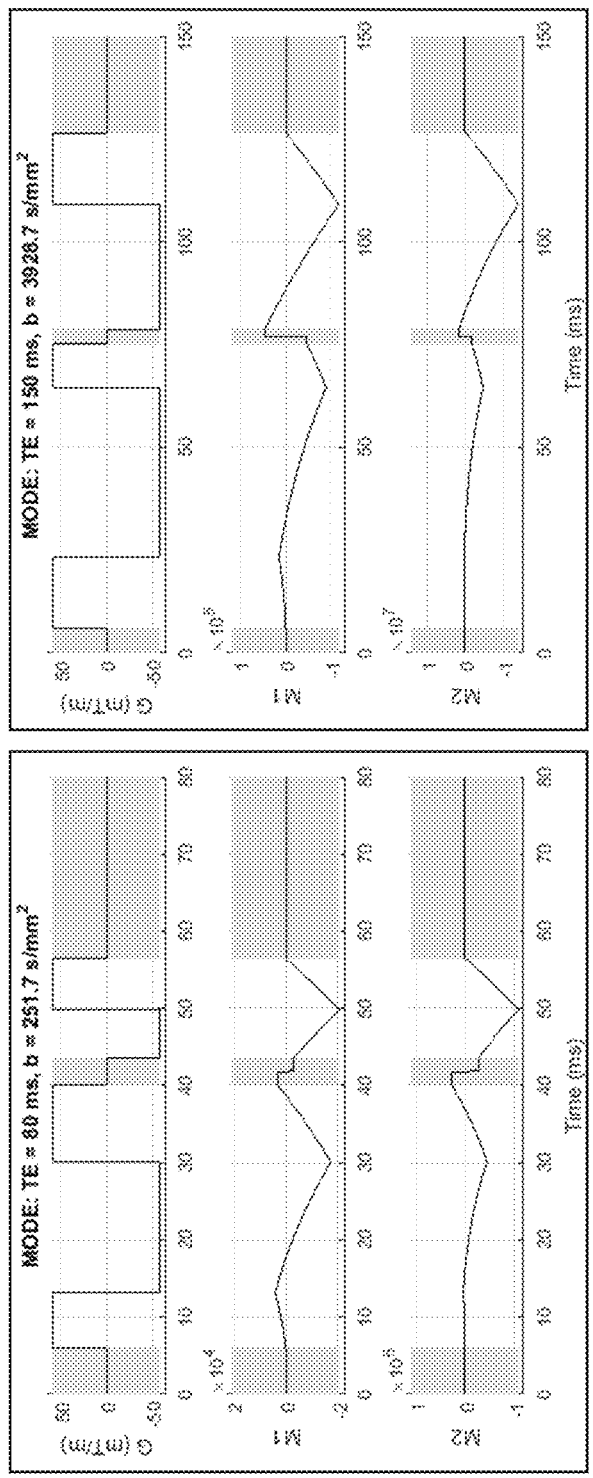
FIGS. 4A and 4B illustrate optimal waveform configurations created by an exemplary MODE process for two exemplary echo times (TE), wherein the TE of FIG. 4A is less than the TE of FIG. 4B.

Observation of FIG. 4A reveals several features. First, maximum gradients are utilized so the 4 square pulses in SLOT_1 combine to effectively yield 3 pulses and the 4 square pulses in SLOT_2 combine to effectively yield 2 pulses. Second, the entire available duration is fully utilized by the gradients. Third, the polarities of the pulses are +−+ for SLOT_1 and −+ for SLOT_2. Accordingly, this optimal waveform configuration, may be referred to as a +−+−+ configuration.

When FIG. 4B is observed in view of FIG. 4A, it can be concluded that while pulse widths change (i.e., according to a longer TE in FIG. 4B), the features of the optimal waveform configuration remain unchanged. In particular, both optimal waveform configuration shown in FIGS. 4A and 4B are +−+−+ configurations.

Moments (i.e., M1 and M2) of the optimal waveform configurations are plotted in FIGS. 4A and 4B. The plots illustrate that motion compensation is guaranteed because moments M1 and M2 accumulate to zero. Accordingly, the optimal waveform configuration (for square pulses) is verified.

A second part of the verification of the optimal waveform configuration 120 exists. Based on the features revealed for the optimal waveform configuration for square pulses, the optimization may be repeated using a waveform model of trapezoidal pulses. The trapezoidal pulses represent realistic gradient waveforms because of their ramp times. In other words, the waveform model using square pulses is used initially to scout for an optimal waveform configuration that is likely to optimize a waveform consisting of a plurality trapezoidal pulses. This approach reduces complexity by initially allowing the square pulses to combine as described above.

Figures 5A, 5B:
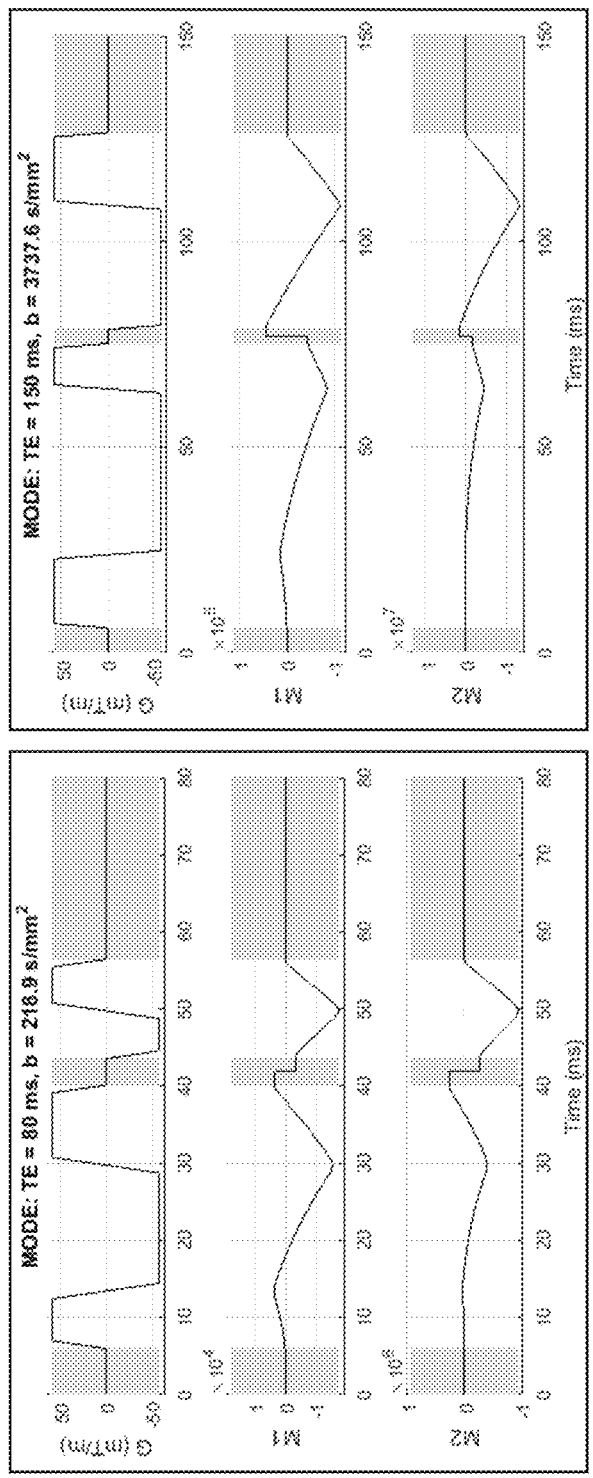
FIGS. 5A and 5B illustrate optimal DEG waveforms created by an exemplary MODE process for two different echo times, wherein the echo time and b-value of FIG. 5A and FIG. 5B are equal to the echo time and b-value of the optimal configurations shown in FIGS. 4A and 4B, respectively.

Continuing the previous example, a DEG waveform 121 can be generated by optimizing the +−+−+ waveform configuration found with square pulses for trapezoidal pulses. The results of the optimization are shown in FIGS. 5A and 5B for two different TE's (i.e., the TE's of FIGS. 4A and 4B respectively). While, the initial conditions of the optimization were set according to the optimal waveform configuration, the amplitudes and polarities were not constrained significantly. The only timing constraints were three pulses in the first slot 301, and two pulses in the second slot 302. The initial conditions were completely random, but the optimized waveforms were found to have the waveform configurations obtained from the square waveforms. The resulting DEG waveforms shown in FIGS. 5A and 5B are identical waveform configurations as the square waveforms. In other words the waveform configurations shown in FIGS. 5A and 5B are +−+−+ configurations and have zero M1 and M2. Accordingly, the DEG waveforms 121 for each TE are obtained and verified.

Had the verification results shown another configuration, a violation of the constraints, and/or a reduction in b-value, the resulting DEG waveform would not have been verified. In addition, had the results returned a non-zero M1 and M2, the DEG waveform would not have been verified to compensate for motion.

The resulting DEG waveform 121 has an optimal waveform configuration that has a small number of parameters for adjustment. As a result, expressions (i.e., closed-form equations, formulas, etc.) for the waveforms can be determined 130 and used for implementation.

In some embodiments the formulas for optimal DEG waveforms (i.e., MODE waveforms) may be recorded on an MRI system 140 (e.g., on the scanning computer 141). An MRI technician may enter precise values (e.g., of scan parameters 143, or b-values 144) into a user interface. Then, the scanner computer can use the formulas and the entered values to determine an optimal DEG waveform nearly instantly because no iterative calculations are required. Thus, the MODE approach is faster and more versatile than storing a collection of waveform samples for a handful of possible scanning parameters.

It should be noted that while certain embodiments have been disclosed, other embodiments and/or variations are possible. For example, while a pulse sequence with two slots for diffusion gradients (i.e., SLOT_1 and SLOT_2) has been used to illustrate the MODE process, it is possible to utilize the MODE process with pulse sequences that have more than two available time slots (e.g., three slots). In another example, while DW-MRI has been discussed as the application of the MODE process, the principles embraced by the present disclosure may be used to optimize gradient waveforms for other imaging techniques that rely on contrast preparation using gradients prior to readout. For example, MR Elastography and flow imaging are within the scope of the present disclosure.

Figure 6:
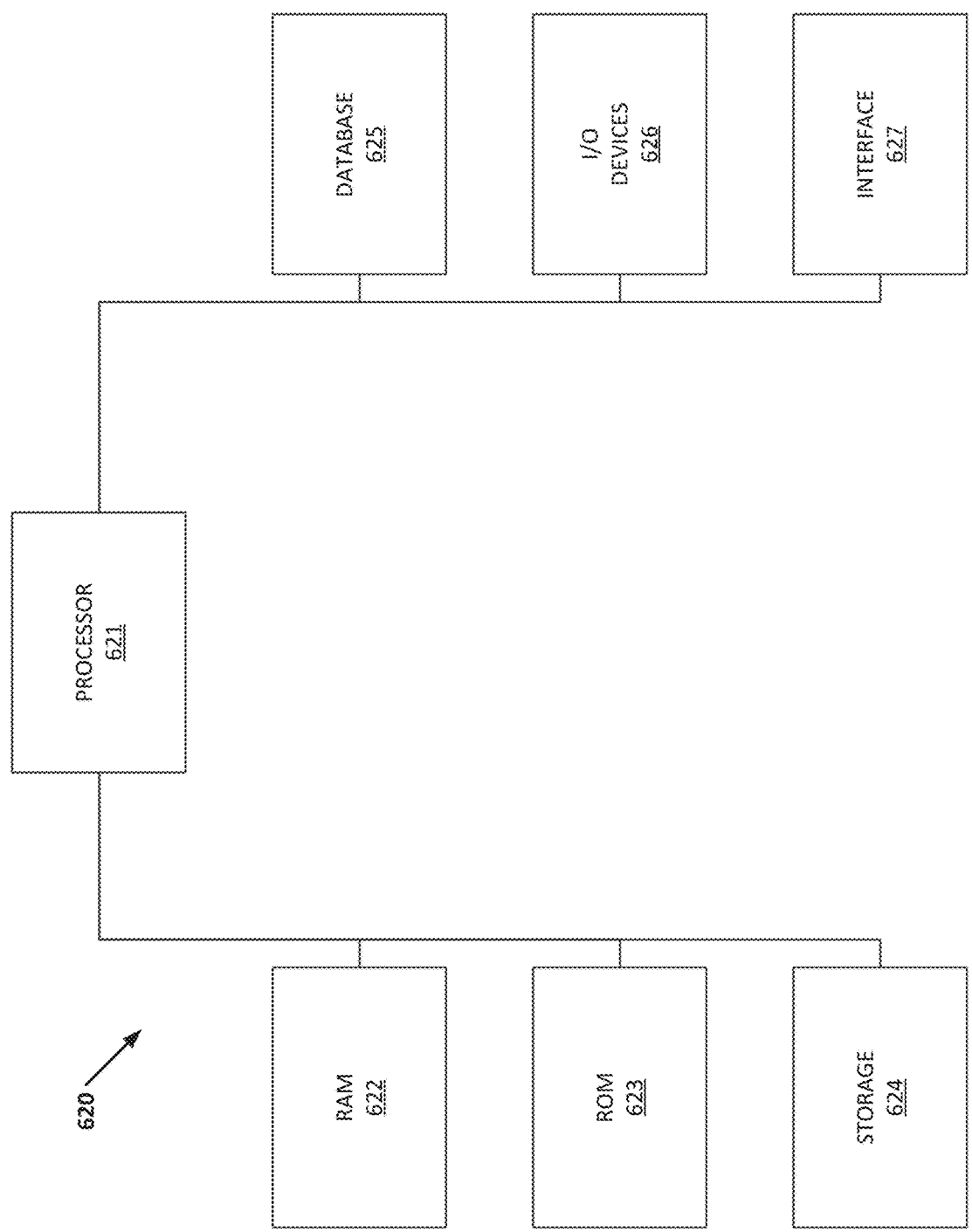
FIG. 6 illustrates an exemplary computer that can be used to practice aspects of the disclosed embodiments.

As part of an exemplary MRI system, embodiments of the disclosed methods for computing optimal diffusion encoding gradient waveforms for MRI may have aspects that are controlled and/or performed by a computing device, which may comprise a portion of or all of the exemplary MRI system. FIG. 6 illustrates an exemplary computer 620 that can be used. As used herein, "computer" may include a plurality of computers. The computers may include one or more hardware components such as, for example, a processor 621, a random access memory (RAM) module 622, a read-only memory (ROM) module 623, a storage 624, a database 625, one or more input/output (I/O) devices 626, and an interface 627. Alternatively and/or additionally, computer 620 may include one or more software components such as, for example, a computer-readable medium including computer executable instructions for performing methods associated with the exemplary embodiments. It is contemplated that one or more of the hardware components listed above may be implemented using software. For example, storage 624 may include a software partition associated with one or more other hardware components. It is understood that the components listed above are exemplary only and not intended to be limiting.

Processor 621 may include one or more processors, each configured to execute instructions and process data to perform one or more functions associated with a computer for performing the disclosed methods for computing optimal diffusion encoding gradient waveforms for MRI and/or controlling the exemplary MRI system. Processor 621 may be communicatively coupled to RAM 622, ROM 623, storage 624, database 625, I/O devices 626, and interface 627. Processor 621 may be configured to execute sequences of computer program instructions to perform various processes. The computer program instructions may be loaded into RAM 622 for execution by processor 621. As used herein, processor refers to a physical hardware device that executes encoded instructions for performing functions on inputs and creating outputs.

RAM 622 and ROM 623 may each include one or more devices for storing information associated with operation of processor 621. For example, ROM 623 may include a memory device configured to access and store information associated with computer 620, including information for identifying, initializing, and monitoring the operation of one or more components and subsystems. RAM 622 may include a memory device for storing data associated with one or more operations of processor 621. For example, ROM 623 may load instructions into RAM 622 for execution by processor 621.

Storage 624 may include any type of mass storage device configured to store information that processor 621 may need to perform processes consistent with the disclosed embodiments. For example, storage 624 may include one or more magnetic and/or optical disk devices, such as hard drives, CD-ROMs, DVD-ROMs, or any other type of mass media device.

Database 625 may include one or more software and/or hardware components that cooperate to store, organize, sort, filter, and/or arrange data used by computer 620 and/or processor 621. For example, database 625 may store hardware and/or software configuration data associated with input-output hardware devices and controllers, as described herein. It is contemplated that database 625 may store additional and/or different information than that listed above.

I/O devices 626 may include one or more components configured to communicate information with a user associated with computer 620. For example, I/O devices may include a console with an integrated keyboard and mouse to allow a user to maintain a database of MRI data. I/O devices 626 may also include a display including a graphical user interface (GUI) for outputting information on a monitor. I/O devices 626 may also include peripheral devices such as, for example, a printer for printing information associated with computer 620, a user-accessible disk drive (e.g., a USB port, a floppy, CD-ROM, or DVD-ROM drive, etc.) to allow a user to input data stored on a portable media device, a microphone, a speaker system, or any other suitable type of interface device.

Interface 627 may include one or more components configured to transmit and receive data via a communication network, such as the Internet, a local area network, a workstation peer-to-peer network, a direct link network, a wireless network, or any other suitable communication platform. For example, interface 627 may include one or more modulators, demodulators, multiplexers, demultiplexers, network communication devices, wireless devices, antennas, modems, and any other type of device configured to enable data communication via a communication network.

While the methods and systems have been described in connection with preferred embodiments and specific examples, it is not intended that the scope be limited to the particular embodiments set forth, as the embodiments herein are intended in all respects to be illustrative rather than restrictive.

The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

The invention claimed is:

1. A method for determining a diffusion encoding gradient (DEG) waveform for an MRI pulse sequence running on an MRI system, the method comprising:
    creating a parametric waveform model comprised of a plurality of pulses that form the MRI pulse sequence, wherein each pulse can be described with a pulse equation using one or more parameters including shape, amplitude, polarity, start time, end time, and ramp time;
    constraining the parametric waveform model according to one or more constraints including (i) timing constraints that limit the plurality of pulses to one or more particular periods of time and/or specify a distribution of the plurality of pulses, (ii) system constraints of the MRI system that limit a maximum amplitude of the plurality of pulses, and (iii) motion compensation constraints that prescribe a particular characteristic for DEG signals based on an overall shape of the DEG waveform;
    optimizing the parametric waveform model by iteratively adjusting the one or more parameters, wherein the optimization maximizes a b-value equation given the one or more parameters of the MRI pulse sequence, wherein the b-value is a value determined by the b-value equation that measures a degree of diffusion weighting applied, which indicates an amplitude, time of applied gradients, and a duration between paired gradients;
    determining one or more DEG waveform equations from the optimized parametric waveform model;
    obtaining a desired b-value for a desired diffusion weighting; and
    computing the DEG waveform using the one or more DEG waveform equations and the desired b-value, wherein the DEG waveform minimizes the echo time (TE) and compensates for motion for the desired diffusion weighting.

2. The method according to claim 1, wherein the timing constraints require the plurality of pulses to fill a first slot and a second slot separated by a period.

3. The method according to claim 1, wherein the timing constraints require no pulses in the plurality of pulses overlap.

4. The method according to claim 1, wherein the system constraints limit the minimum ramp time of the plurality of pulses.

5. The method according to claim 1, wherein the motion compensation constraints require a first moment (M1) of the DEG waveform to equal zero.

6. The method according to claim 1, wherein the motion compensation constraints require a second moment (M2) of the DEG waveform equal zero.

7. The method according to claim 1, wherein the MM pulse sequence is an echo-planar imaging (EPI) diffusion sequence.

8. The method according to claim 1, wherein the exact equation for b value equation is:

$$b = \gamma^2 \int_0^{\tau_{diff}} (\int_0^t G(u) du)^2 dt,$$

wherein $\gamma$=gyromagnetic ratio, G(u)=gradient amplitude, t=time, and $\tau_{diff}$ is the time utilized for diffusion preparation.

9. The method according to claim 1, wherein optimizing the parametric waveform model comprises adjusting parameters of a plurality of square pulses to determine an optimal waveform configuration.

10. The method according to claim 9, wherein the optimal waveform configuration defines a distribution of the plurality of square pulses between available slots in the Mill pulse sequence.

11. The method according to claim 9, wherein the optimal waveform configuration defines polarities of the plurality of square pulses.

12. The method according to claim 9, wherein the optimal waveform configuration defines the magnitudes of the plurality of square pulses.

13. The method according to claim 12, wherein the magnitudes of the plurality of square pulses is a maximum gradient strength of the MM system.

14. The method according to claim 9, wherein the optimal waveform configuration effectively combines adjacent pulses of the same magnitude and polarity into a single pulse.

15. The method according to claim 14, wherein the optimal configuration that combines adjacent pulses may be described using fewer parameters than an optimal waveform configuration having no adjacent pulses that are combined.

16. The method according to claim 15, wherein the optimization of a parametric waveform model further comprises verifying the optimal waveform configuration is valid for a plurality of trapezoidal pulses by re-optimizing the optimal configuration using trapezoidal pulses and comparing the results to the optimal waveform configuration of square pulses.

17. The method according to claim 16, wherein the equations for the DEG waveform are derived from the verified optimal configuration of the trapezoidal pulses.

18. The method according to claim 17, further comprising storing the equations on the MM system to facilitate the generation of a MM pulse sequence comprising an optimal DEG waveform for a particular diffusion weighting.

* * * * *

UNITED STATES PATENT AND TRADEMARK OFFICE
CERTIFICATE OF CORRECTION

PATENT NO. : 10,816,630 B2
APPLICATION NO. : 16/015291
DATED : October 27, 2020
INVENTOR(S) : Majeed Waqas et al.

It is certified that error appears in the above-identified patent and that said Letters Patent is hereby corrected as shown below:

In the Claims

Claim 7, Column 11, Line 10, "MM" should read --MRI--.

Claim 8, Column 11, Lines 13-14, "exact equation for" should be deleted.

Claim 10, Column 11, Line 25, "Mill" should read --MRI--.

Claim 13, Column 12, Line 6, "MM" should read --MRI--.

Claim 18, Column 12, Line 26, "MM" should read --MRI--.

Claim 18, Column 12, Line 27, "MM" should read --MRI--.

Signed and Sealed this
Twenty-third Day of February, 2021

Drew Hirshfeld
*Performing the Functions and Duties of the
Under Secretary of Commerce for Intellectual Property and
Director of the United States Patent and Trademark Office*